United States Patent
Tanaka et al.

(10) Patent No.: US 7,221,692 B2
(45) Date of Patent: May 22, 2007

(54) SEMICONDUCTOR LASER DEVICE AND ITS MANUFACTURING METHOD

(75) Inventors: Akira Tanaka, Kanagawa (JP); Yoshiyuki Itoh, Saitama (JP); Osamu Horiuchi, Kanagawa (JP); Akio Makuta, Kanagawa (JP); Koichi Gen-Ei, Chiba (JP); Hideo Shiozawa, Kanagawa (JP)

(73) Assignee: Kabushiki Kaisha Toshiba, Minato-Ku, Tokyo (JP)

(*) Notice: Subject to any disclaimer, the term of this patent is extended or adjusted under 35 U.S.C. 154(b) by 219 days.

(21) Appl. No.: 10/845,666

(22) Filed: May 13, 2004

(65) Prior Publication Data
US 2005/0030997 A1 Feb. 10, 2005

(30) Foreign Application Priority Data
May 14, 2003 (JP) .............................. 2003-135408

(51) Int. Cl.
*H01S 5/00* (2006.01)
(52) U.S. Cl. .............................. 372/45.01; 372/43.01; 372/46.01
(58) Field of Classification Search ................ 372/324, 372/43.01–46.01, 49.01
See application file for complete search history.

(56) References Cited

U.S. PATENT DOCUMENTS

| | | | | |
|---|---|---|---|---|
| 5,065,404 A | * | 11/1991 | Okajima et al. ......... | 372/46.01 |
| 5,255,281 A | * | 10/1993 | Sugano et al. ........... | 372/46.01 |
| 5,438,585 A | * | 8/1995 | Armour et al. .......... | 372/45.01 |
| 6,118,800 A | * | 9/2000 | Kidoguchi et al. .... | 372/45.013 |
| 6,444,486 B1 | * | 9/2002 | Kwak et al. ................. | 438/47 |
| 6,545,296 B1 | * | 4/2003 | Mukaihara et al. ........... | 257/79 |
| 6,573,116 B2 | * | 6/2003 | Watanabe et al. ............. | 438/32 |
| 6,618,411 B1 | * | 9/2003 | Takiguchi et al. ....... | 372/45.01 |
| 6,618,416 B1 | | 9/2003 | Taneya et al. | |
| 2004/0022287 A1 | | 2/2004 | Yoshitake et al. | |

OTHER PUBLICATIONS

PCT Patent Application No. PCT/JP99/04922 filed on Nov. 29, 2002 entitled "Semiconductor Laser Element, Method of Fabrication Thereof, And Multi-Wavelength Monolithic Semiconductor Laser Device," Tanaka, et al., Publication No. WO 00/21169.

* cited by examiner

Primary Examiner—Minsun Oh Harvey
Assistant Examiner—Phillip Nguyen
(74) Attorney, Agent, or Firm—DLA Piper US LLP

(57) ABSTRACT

A semiconductor laser device comprises: a cladding layer of a first conductivity type; an active layer provided on the cladding layer; and a cladding layer of a second conductivity type provided on the active layer. At least a part of the cladding layer of the second conductivity type has a ridge stripe. The ridge stripe includes: an upper part having substantially vertical sidewalls; and a lower portion having sidewalls inclined so that the stripe becomes wider toward the active layer.

3 Claims, 17 Drawing Sheets

HORIZONTAL OPTICAL
INTENSITY DISTRIBUTION

VERTICAL OPTICAL INTENSITY DISTRIBUTION

SEMICONDUCTOR LASER DEVICE AND ITS MANUFACTURING METHOD

CROSS-REFERENCE TO RELATED APPLICATIONS

This application is based upon and claimed the benefits of priority from the prior Japanese Patent Application No.2003-135408, filed on May 14, 2003, the entire contents of which are incorporated herein by reference.

BACKGROUND OF THE INVENTION

This invention relates to semiconductor laser device and its manufacturing method, especially to those of ridge wave-guide semiconductor laser.

In recent years, the semiconductor laser whose oscillation wavelength is within the range of 600–700 nm is widely used in DVD (digital versatile disc) video player and DVD-ROM (read only memory) drive. Also rewritable and write-once DVD recorder market is rapidly growing and those recorders need higher output semiconductor laser as compared with DVD-ROM. In many laser structures, ridge wave-guide laser is adequate for DVDs.

FIG. 15 is a cross-sectional view of ridge wave-guide semiconductor laser device. This semiconductor laser has a double hetero-junction composed of InGaAlP formed on a GaAs substrate, an upper cladding layer having a ridge shape thereon and a current blocking layer on both sides of the ridge shape cladding layer. Since the current blocking layer is transparent at oscillation wavelength, this structure is called "real refractive-index wave guide".

Manufacturing process of this semiconductor laser is explained as follows.

First, an n-type cladding layer 2 of $In_{0.5}(Ga_{0.3}Al_{0.7})_{0.5}P$, a guide layer 3 of $In_{0.5}(Ga_{0.5}Al_{0.5})_{0.5}P$, an MQW active layer 4 of InGaP/InGaAlP, a guide layer 5 of $In_{0.5}(Ga_{0.5}Al_{0.5})_{0.5}P$, a first cladding layer 6 of $In_{0.5}(Ga_{0.3}Al_{0.7})_{0.5}P$, a p-type etching stop layer of $In_{0.5}Ga_{0.5}P$, a p-type second cladding layer 8 of $In_{0.5}(Ga_{0.3}Al_{0.7})_{0.5}P$, and a p-type intermediate layer 9 of $In_{0.5}Ga_{0.5}P$ are grown sequentially on the n-type GaAs substrate 1.

Subsequently by etching the intermediate layer 9 and the second cladding layer 8 vertically using RIE (reactive ion etching), a ridge stripe 10 is formed. An n-type current blocking layer 11 of $In_{0.5}Al_{0.5}P$ is grown on both sides of the ridge stripe 10, and a p-type GaAs contact layer 12 is grown thereon. Finally, an n-side electrode 13 is formed on a backside of the substrate 1, and then a p-side electrode 14 is formed on the p-type GaAs contact layer 12.

This ridge stripe lasers has advantages to control the stripe width strictly and hence to obtain the excellent laser performance because the vertical sidewalls are formed by anisotropic RIE etching technique. Such a ridge stripe laser is disclosed in PCT international publication number WO 00/021169 A1.

However, there occur problems explained below in such ridge stripe laser.

FIG. 16 is a cross-sectional view near the lower corner edge of the ridge stripe. When the n-type current blocking layer 11 of $In_{0.5}Al_{0.5}P$ is grown on the cladding layer 6 and the sidewalls of ridge stripe 10, the crystal grows perpendicularly to both surfaces, respectively, as shown with arrows G1 and G2. Because crystal growth directions G1 and G2 are approximately perpendicular to each other, the growth fronts collide near the lower corner edge of the ridge stripe 10. In this collision region, the growth surface morphology becomes poor and hence crystal defects increase. This defect-rich region "D" is shown in FIG. 16 by hatching.

Since the defect-rich region D includes a lot of crystal defects, current blocking effect becomes imperfect. Therefore, the leak current and the threshold current increase.

One example of the defect-rich region is explained hereafter. In a case of MOCVD (metal-organic chemical vapor deposition) process, material gases are not supplied sufficiently near the lower corner edge of the ridge stripe 10. Therefore, an imperfect layer which contains the voids is grown in the current blocking layer 11, as shown in FIG. 17.

The leak current increases if such voids are formed in the current blocking layer 11. Also because an optical absorptive GaAs contact layer 12 penetrates into the voids near a light emitting region, an optical loss occurs and causes the lower light emitting efficiency.

SUMMARY OF THE INVENTION

According to an aspect of the invention, there is provided a semiconductor laser device comprising: a cladding layer of a first conductivity type; an active layer provided on the cladding layer; and a cladding layer of a second conductivity type provided on the active layer, at least a part of the cladding layer of the second conductivity type having a ridge stripe, and the ridge stripe including: an upper portion having substantially vertical sidewalls; and a lower portion having sidewalls inclined so that the stripe becomes wider toward the active layer.

According to another aspect of the invention, there is provided a semiconductor laser device comprising: a first semiconductor laser element monolithically formed on a substrate; and a second semiconductor laser element monolithically formed on the substrate, wherein a wavelength of a laser light emitted from the first semiconductor laser element and a wavelength of a laser light emitted from the second semiconductor laser element are different, the first semiconductor laser element includes: a first cladding layer of a first conductivity type; a first active layer provided on the first cladding layer; and a second cladding layer of a second conductivity type provided on the first active layer, at least a part of the second cladding layer having a ridge stripe, and the ridge stripe including: an upper portion having substantially vertical sidewalls; and a lower portion provided having sidewalls inclined so that the stripe becomes wider toward the first active layer, and the second semiconductor laser element includes: a third cladding layer of a first conductivity type; a second active layer provided on the third cladding layer; and a fourth cladding layer of a second conductivity type provided on the second active layer, at least a part of the fourth cladding layer having a ridge stripe, and the ridge stripe including: an upper portion having substantially vertical sidewalls; and a lower portion having sidewalls inclined so that the stripe becomes wider toward the second active layer.

According to another aspect of the invention, there is provided a semiconductor laser device comprising: an AlGaAs based laser element monolithically formed on a substrate; and an InGaAlP based laser element monolithically formed on the substrate, a wavelength of a laser light emitted from the AlGaAs based laser element and a wavelength of a laser light emitted from the InGaAlP based laser element being different, the AlGaAs based laser element having: a first cladding layer of a first conductivity type; a first active layer provided on the first cladding layer, and including $Al_yGa_{1-y}As$ (0≦y≦0.2): a second cladding layer of a second conductivity type provided on the first active layer; and a third cladding layer of a second conductivity type provided on the second cladding layer, the third cladding layer being made of $In_{0.5}(Ga_{1-x}Al_x)_{0.5}P$, and at least a part of the third cladding layer having a ridge stripe including: a first upper portion having vertical sidewalls; and a first lower portion having sidewalls inclined so that the stripe becomes wider toward the first active layer, and the InGaAlP based laser element having: a fourth cladding layer of a first conductivity type; a second active layer provided on the fourth cladding layer, and including $In_{0.5}(Ga_{1-u}Al_u)_{0.5}P$ (0≦u≦0.2); a fifth cladding layer of a second conductivity type provided on the second active layer; and a sixth cladding layer of a second conductivity type provided on the fifth cladding layer, the six the cladding layer being made of InGaAlP based material whose composition is substantially the same as that of the third cladding layer, and at least a part of the sixth cladding layer having a ridge stripe including: a second upper portion having vertical sidewalls; and a second lower portion having sidewalls inclined so that the stripe becomes wider toward the second active layer.

According to another aspect of the invention, there is provided a method for manufacturing a semiconductor laser device comprising: forming a cladding layer of a first conductivity type, an active layer and a cladding layer of a second conductivity type sequentially on a major surface of a substrate; forming a first stripe mask on the cladding layer of a second conductivity type; forming an upper portion having vertical sidewalls substantially vertical to the major surface by vertically etching a part of the cladding layer of a second conductivity type which is not covered by the first stripe mask; forming a second mask on the vertical sidewalls; forming a lower portion having inclined sidewalls by etching the cladding layer of a second conductivity type exposed around the upper portion; and forming a current blocking layer to cover both sides of the lower portion and the upper portion, the current blocking layer is made of a material whose refractive index is lower than that of the cladding layer of a second conductivity type.

BRIEF DESCRIPTION OF THE DRAWINGS

The present invention will be understood more fully from the detailed description given below and from the accompanying drawings of the embodiments of the invention. However, the drawings are not intended to imply limitation of the invention to a specific embodiment, but are for explanation and understanding only.

In the drawings.

DETAILED DESCRIPTION

Referring to drawings, some embodiments of the present invention will now be described in detail.

(First Embodiment)

Figure 1:
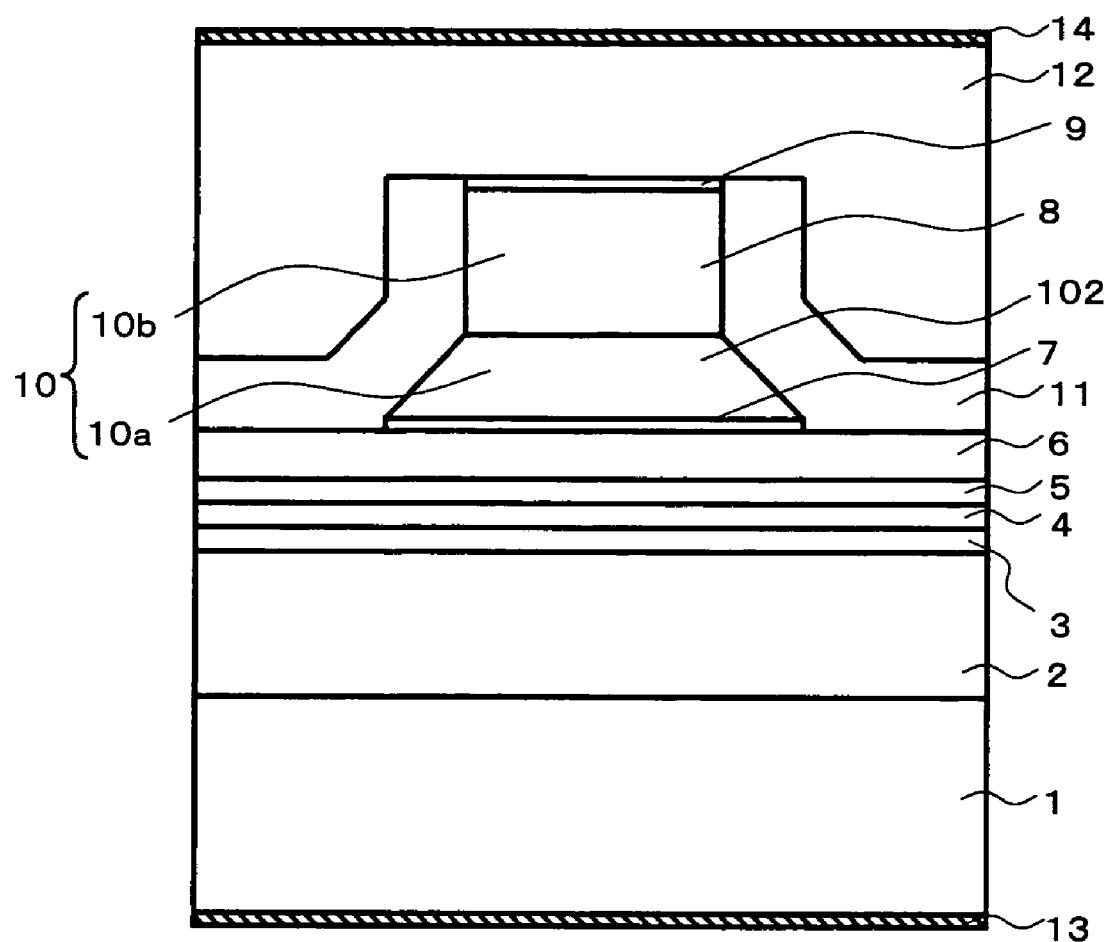
FIG. 1 is a cross-sectional view of the semiconductor laser device according to a first embodiment of the invention.

FIG. 1 is a cross-sectional view of the semiconductor laser device according to a first embodiment. This figure shows a cross-sectional view of the ridge stripe laser perpendicular to the optical resonance axis.

One of a feature of this invention is a ridge stripe which comprises an upper portion having vertical sidewalls and a lower portion widening toward an active layer, as shown in FIG. 1. By using this unique ridge stripe structure, high quality embedded layers are formed on both sides of the ridge stripe, while maintaining an excellent performance of the ridge stripe.

Hereafter, the structure of this semiconductor laser is explained in detail.

An n-type lower cladding layer 2 of $In_{0.5}(Ga_{0.3}Al_{0.7})_{0.5}P$, an optical guide layer 3 of $In_{0.5}(Ga_{0.5}Al_{0.5})_{0.5}P$, an MQW (multi-quantum well) active layer 4 of InGaP/InGaAlP, an optical guide layer 5 of $In_{0.5}(Ga_{0.5}Al_{0.5})_{0.5}P$, a p-type upper first cladding layer 6 of $In_{0.5}(Ga_{0.3}Al_{0.7})_{0.5}P$, a p-type etching stop layer 7 of $In_{0.5}Ga_{0.5}P$, a p-type upper second cladding layer 8 of $In_{0.5}(Ga_{0.3}Al_{0.7})_{0.5}P$, a p-type intermediate layer 9 of $In_{0.5}Ga_{0.5}P$ and p-type GaAs contact layer are formed sequentially on a n-type GaAs substrate 1.

The second cladding layer 8 is patterned to a ridge stripe 10 which comprises the upper portion 10b having the vertical sidewalls and the lower portion 10a widening toward the active layer. The n-type current blocking layer 11 of $In_{0.5}Al_{0.5}P$ is embedded on the both sides of the ridge stripe 10 (10a, 10b). After the GaAs contact layer 12 growing, the wafer surface is flattened approximately. An n-side electrode 13 is formed on the backside of a substrate 1, and a p-side electrode 14 is formed on the contact layer 12.

An operation current is concentrated in the ridge stripe 10 by the current blocking layer 11. As for the material of the current blocking layer 11, it is desirable that the current blocking layer has a lower refractive-index than the cladding layers 6 and 8, and a wider band gap than the cladding layers 6 and 8.

If the band gap of the cladding layers 6 and 8 is wider than that of the active layer 4, and the band gap of current blocking layer 11 is wider than that of the cladding layer 6 and 8, then the laser light which penetrates into the cladding layer and the current blocking layer is not absorbed in the current blocking layer. Therefore, the optical loss of guided laser light is reduced.

If aluminum composition ratio increases, the band gap becomes wider in AlGaAs and InGaAlP lasers which are widely used in the optical disk system.

When the band gap of the current blocking layer 11 is wider than that of the cladding layers 6 and 8, a refractive-index of current blocking layer becomes low as compared with that of the cladding layer. Then laser light is confined due to the refractive-index difference in the cladding layer 6 and 8. This structure is called "real refractive-index wave guide laser".

An optical loss in complex refractive-index waveguide laser is as high as 20 cm$^{-1}$ approximately because an optical absorption occurs in the current blocking layer 11. On the other hand, as the optical loss in real refractive index laser is as low as 5 cm$^{-1}$ approximately, a smaller operation current laser becomes possible.

If a width of the ridge stripe varies widely, a confinement effect in lasing region varies, a beam radiation angle varies and resistance varies. These are the problems of the conventional laser.

On the other hand, the semiconductor laser according to the first embodiment makes it possible to form a fine stripe by the anisotropic etching technology like RIE. As a result, the ridge stripe is formed with the predetermined width at a specified position regardless of the crystal orientation and the wafer off-angle.

Moreover, it becomes possible to improve drastically the crystallinity of the current blocking layer 11 which is embeds both sides by providing the lower portion widening toward the active layer.

Figure 2A:
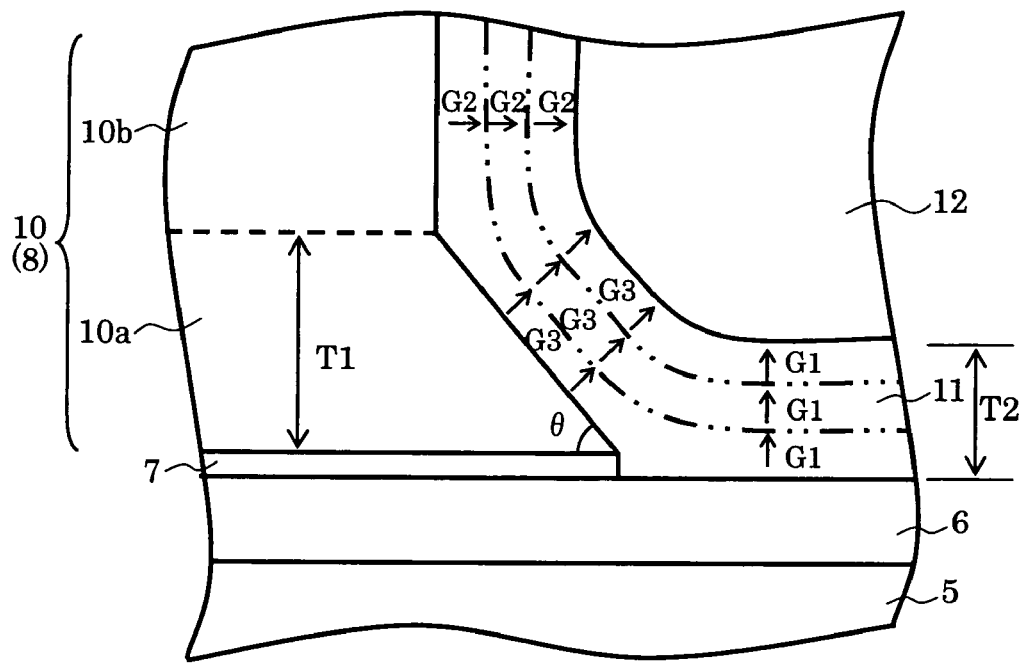
FIG. 2A is a cross-sectional view expanded near the lower corner edge of the ridge stripe according to a first embodiment of the invention.
Figure 2B:
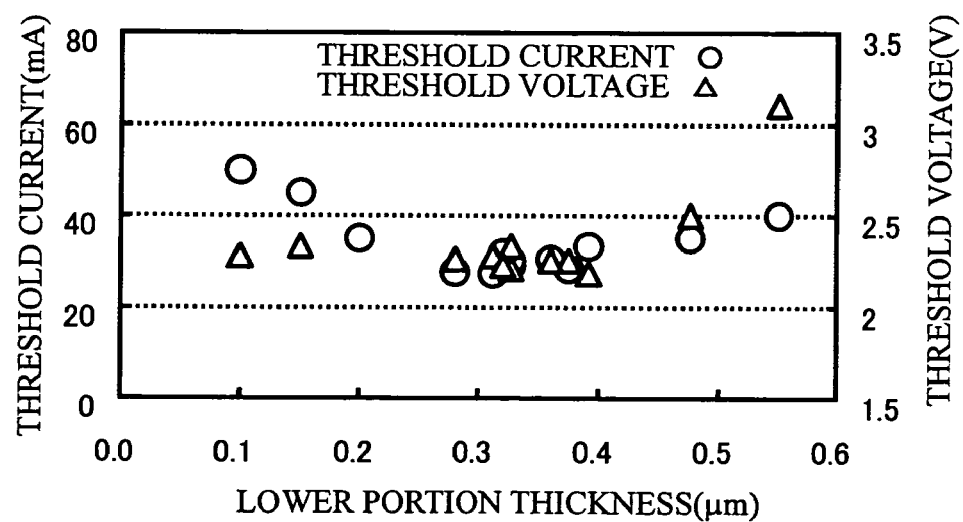
FIG. 2B shows the relationship between a threshold current and a lower portion of the ridge stripe height.

FIG. 2A is a cross-sectional view expanded near the lower corner edge of the ridge stripe. FIG. 2B is a graphical representation explaining a threshold current and a voltage dependency on the lower portion thickness (T1) of the ridge, wherein a bottom width of the lower portion is 2.5 μm.

If the lower portion thickness (T1) becomes larger than 0.5 μm, the upper portion width of ridge stripe 10 becomes small and hence a threshold voltage becomes higher. On the contrary, if T1 becomes smaller than 0.2 μm, a threshold current becomes higher. Therefore, optimum T1 is within the range of 0.2–0.5 μm, as shown in FIG. 2B.

The reason why a threshold current increases in a case of thinner T1 less than 0.2 μm can be explained below.

Figure 16:
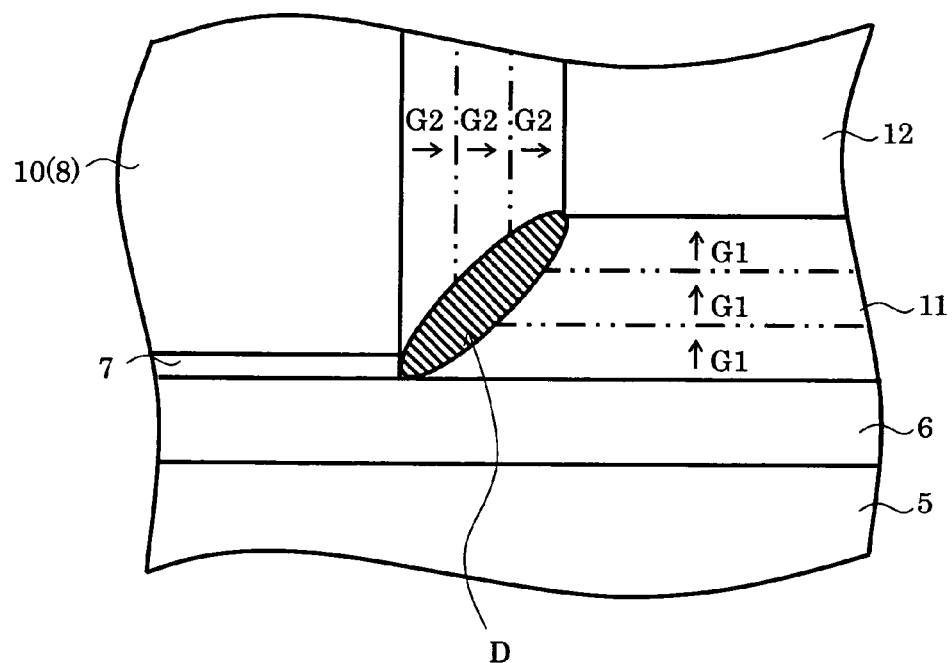
FIG. 16 is a cross-sectional view near the lower corner edge of the ridge stripe.
Figure 17:
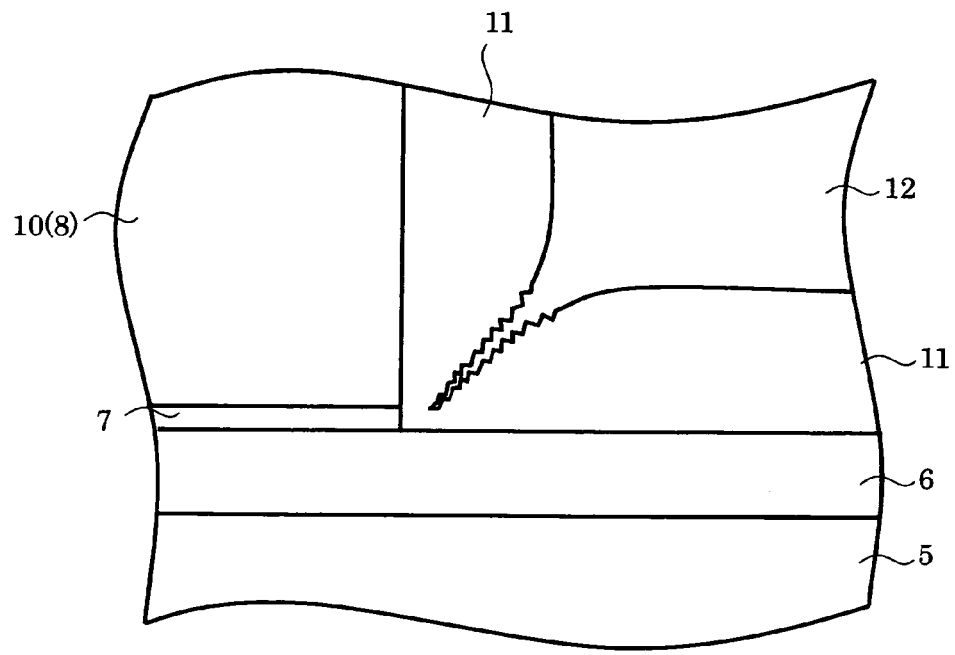
FIG. 17 is a cross-sectional view showing the current blocking layer which contains the voids caused by the imperfect crystal growth near the lower corner edge of the ridge stripe.

If the lower portion of the ridge has an inclining portion, the crystal grows on the surface of the inclining portion toward direction G3. Consequently, the current blocking layer 11 can be grown continuously in the vicinity of the lower corner edge of the ridge stripe 10 without such defects as "D" region in FIG. 16 and the voids in FIG. 17, although the growth front directions are different like G1, G2 and G3. As the high quality current blocking layer 11 is grown homogenously according to the first embodiment, an excellent electrical and optical characteristic is achieved without the leak current and the optical loss.

For example, due to the leak current reduction the lower current operation becomes possible and the higher output such as 200 mW becomes possible for DVD-R and RW. Also by reducing the operation current, the lifetime of the semiconductor laser can be improved drastically and hence high reliability can be achieved. Lower operation voltage makes it easy to design the driving circuit.

According to an experimental result by the Inventors, when the lower portion thickness T1 of the ridge was larger than the current blocking layer thickness T2, the embedding growth became stable and a high quality layer was obtained. This means that the relatively thick lower portion is effective during the growth of the relatively thin current blocking layer.

On the other hand, by an experimental result about the inclining angle (θ) dependency, an optimum angle was within the range of 30–60° (degrees).

As for the ridge stripe materials, if the material functions as the cladding layer and wave guide, 10a and 10b are not necessarily composed of the same material.

If a width of the lower portion of 10a becomes gradually wider toward an active layer 4, a side shape is not restricted to a inclining plane, but allowed to be convex upward, convex downward and step-like.

A manufacturing method of the semiconductor laser according to a first embodiment will be now described hereinafter.

FIGS. 3A through 4D are the cross-sectional views showing the manufacturing steps of the semiconductor laser according to a first embodiment.

On the n-type GaAs substrate 1, an n-type lower cladding layer 2 of $In_{0.5}(Ga_{0.3}Al_{0.7})_{0.5}P$, an optical guide layer 3 of $In_{0.5}(Ga_{0.5}Al_{0.5})_{0.5}P$, an MQW active layer 4 of InGaP/InGaAlP, an optical guide layer 5 of $In_{0.5}(Ga_{0.5}Al_{0.5})_{0.5}P$, a p-type upper first cladding layer 6 of $In_{0.5}(Ga_{0.3}Al_{0.7})_{0.5}P$, a p-type etching stop layer 7 of $In_{0.5}Ga_{0.5}P$, a p-type upper second cladding layer 8 of $In_{0.5}(Ga_{0.3}Al_{0.7})_{0.5}P$, a p-type intermediate layer 9 of $In_{0.5}Ga_{0.5}P$ and a p-type GaAs cap layer (not shown) are grown sequentially. Then, the mask 60 which is composed of a silicon dioxide is formed thereon.

Figure 3A:
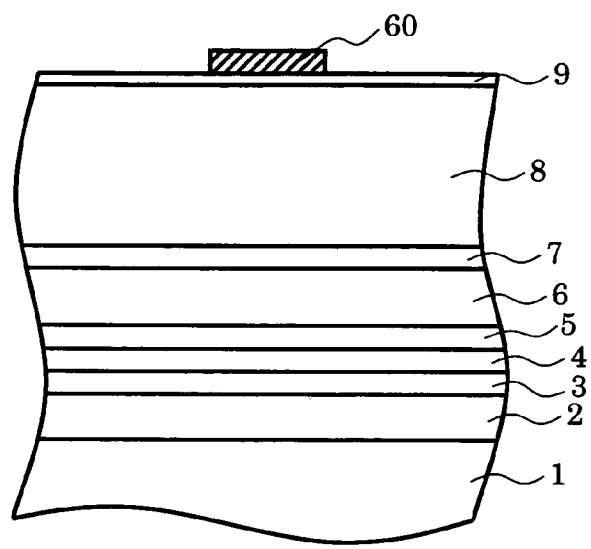
FIGS. 3A through 3C are cross-sectional views sequentially showing manufacturing steps of the semiconductor laser according to a first embodiment of the invention.
Figure 3B:
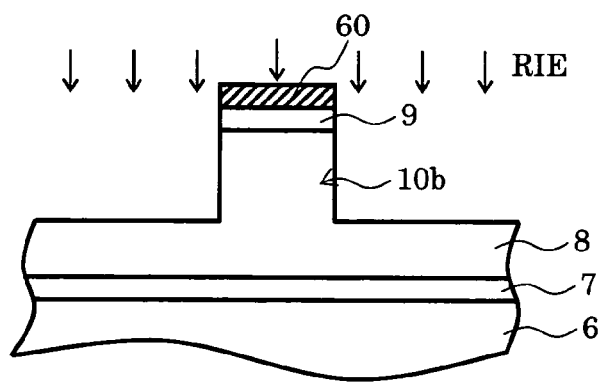

As shown in FIG. 3B, the intermediate layer 9 and a part of the upper second cladding layer 8 are etched approximately vertically by an anisotropic etching technique such as RIE. In this RIE process, argon (Ar) is used as the base gas and chlorine based gases are added like $Cl_2$, $BCl_3$, $SiCl_4$ to obtain the vertical walls on InGaAlP layer. After the anisotropic etching, the ridge stripe 10b having the vertical walls is obtained, as shown in FIG. 3B.

Figure 3C:
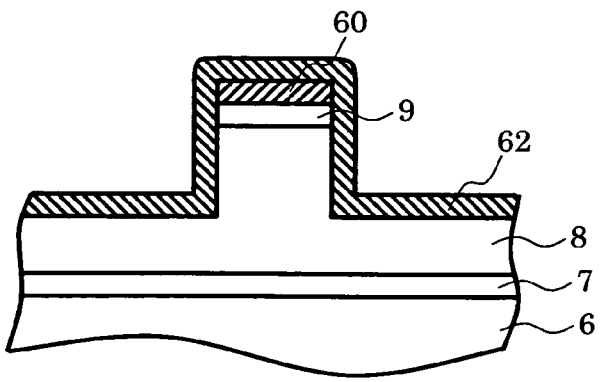

As shown in FIG. 3C, a silicon nitride ($SiN_x$) film 62 is deposited on the surface of the substrate. The silicon nitride film is also used as the RIE etching mask but it is preferable to use the different material from the silicon dioxide, as explained later. Since the silicon nitride film has to be deposited on the vertical walls of the upper portion of the ridge stripe 10b, an isotropic deposition process is needed.

Figure 4A:
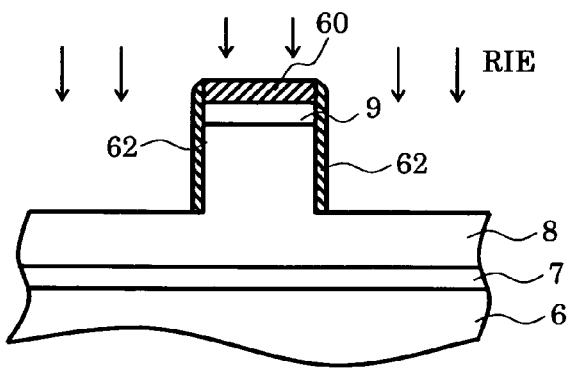
FIGS. 4A through 4D are cross-sectional views sequentially showing manufacturing steps of the semiconductor laser according to a first embodiment of the invention.

As shown in FIG. 4A, after the silicon nitride film 62 is etched vertically using an anisotropic RIE etching process, the horizontal portions of the silicon nitride 62 are removed but the silicon nitride 62 on the vertical walls still remains. Because the silicon dioxide mask 60 has to remain after the second RIE, it is desirable that the etching rates differ a lot between the film 62 and the mask 60. For example, when the mask 60 is formed with the silicon dioxide and the film 62 is formed with the silicon nitride, a relatively high selective etching ratio is obtained by choosing the adequate etching conditions. Therefore, the silicon dioxide mask 60 remains after the second RIE.

Figure 4B:
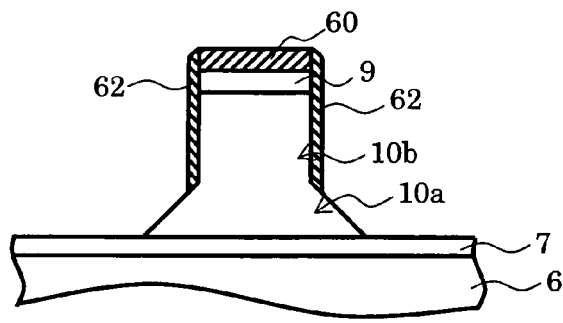

As shown in FIG. 4B, the lower portion 10a of the ridge stripe is formed by etching the second cladding layer 8. At this time, it is desirable to use a wet etching method including mesa etching or isotropic gaseous phase etching. For example, if a phosphoric acid based etching solution is used, (111) surfaces appears. The etching stop layer 7 may be removed using an isotropic etching solution such as Br. The lower current operation is achieved by removing the etching stop layer 7. Therefore, it is easy to form a gradually widening portion toward the active layer (bottom), if the substrate orientation is the (100) surfaces. In this case, the vertical walls of ridge stripe 10b are covered with the film 62.

Figure 4C:
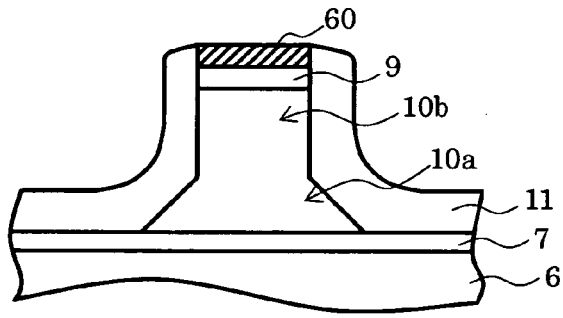
Figure 4D:
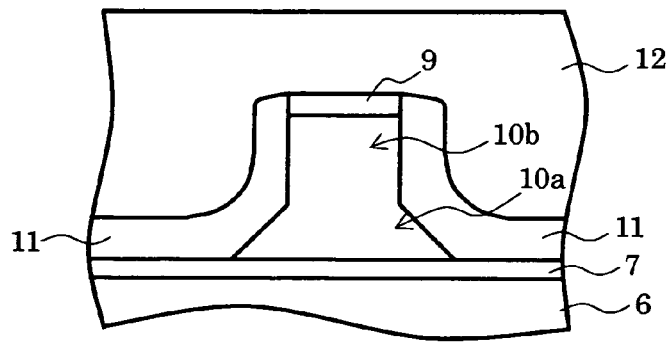

Subsequently the current blocking layer 11 is grown epitaxially as shown in FIG. 4C.

During this growth the current blocking layer 11 can be formed uniformly without the defect-rich region "D" and the voids due to the inclining portion near the lower corner of the ridge stripe, as already described. A thin poly-crystalline layer of the same composition as the current blocking layer 11 grown on the mask 60 can be removed together with the p-type GaAs cap layer by a lift-off technique simultaneously.

Subsequently, after the mask 60 and a p-type cap layer of GaAs (not shown) are removed, a contact layer 12 is grown epitaxially on the entire surface. Finally an n-side electrode 13 and a p-side electrode 14 are formed on both wafer surfaces respectively as shown in FIG. 1.

The manufacturing method of a first embodiment is summarized below:

(1) The upper portion 10b having the vertical sidewalls are formed by the anisotropic etching.

(2) The etching mask 62 is deposited on the sidewalls of 10b and is patterned by RIE.

(3) The lower portion widening toward the active layer is formed by the isotropic etching.

(4) The current blocking layer 11 is embedded on both sides of the ridge stripe without the defect region and the voids.

Consequently a ridge stripe semiconductor laser with the high current efficiency, the excellent optical characteristic and the high reliability is achieved.

In addition, the optimum structural parameters are explained hereinafter.

Since the ridge stripe 10 functions as wave guide, the higher lateral modes cause a kink in the current-optical output characteristic in a case of the wider bottom of the lower portion of the ridge stripe. If the width of the bottom of the lower portion 10a is less than 3.0 μm and the thickness of the p-type upper cladding layer 6 of $In_{0.5}(Ga_{0.3}Al_{0.7})_{0.5}P$ is within the range of 0.1–0.3 μm, more preferably 0.2–0.25 μm, the higher lateral modes are suppressed.

According to this embodiment, even if the width of the bottom of the lower portion 10a becomes narrow, the width of the upper portion 10b remains unchanged. Therefore, the device resistance and the operating voltage do not increase.

In the semiconductor laser comprising the InGaAlP ridge wave guide, InAlP is used as a material of the current blocking layer 11 in many cases and has the current blocking effect by the minimum 0.2 μm thickness because of its wider band gap.

Considering the condition $T1 \geq T2$ (as already explained), it is desirable that the thickness T1 of the lower portion 10a is larger than the thickness T2 of the current blocking layer 11.

According to above relations, it is desirable that the thickness T2 of the current blocking layer is within the range of 0.3 to 0.4 μm.

Another advantage is explained in comparison with the laser which is examined by the Inventors hereinafter.

Figure 5:
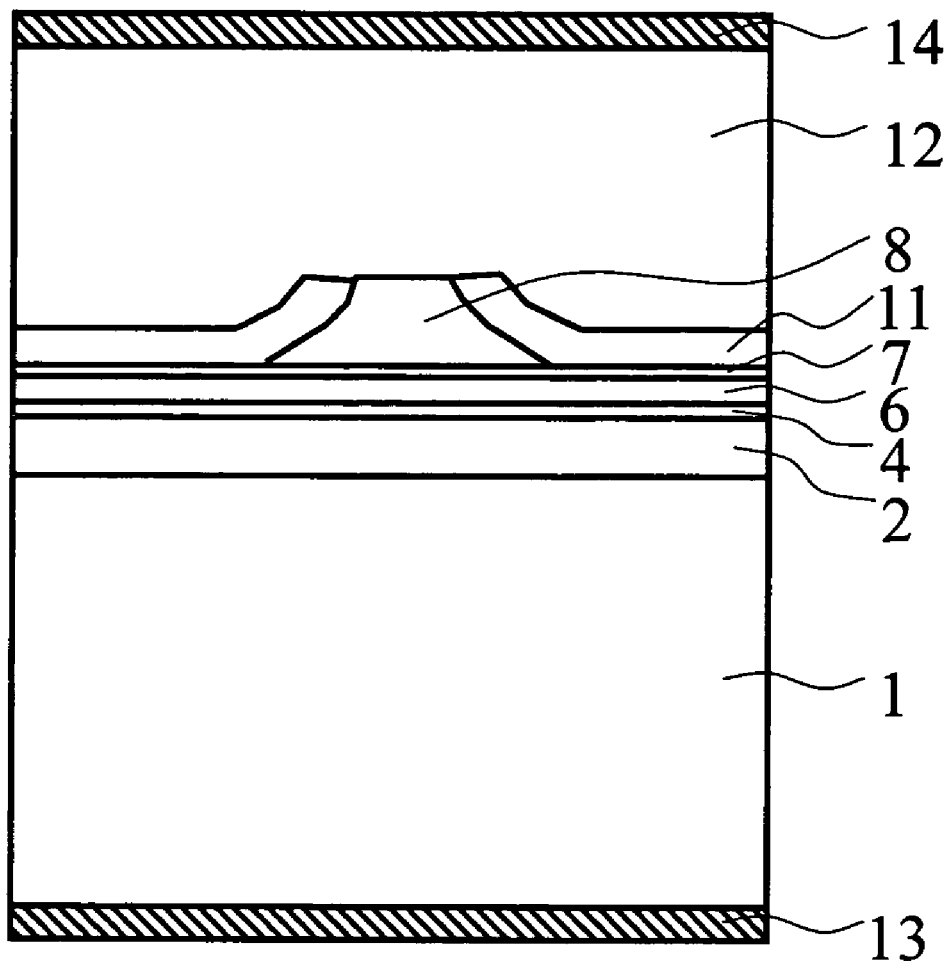
FIG. 5 is a cross-sectional view of the semiconductor laser examined in process in which the Inventors result in this invention.

FIG. 5 is a cross-sectional view showing the semiconductor laser examined by the Inventors. The same number is given to the same element as used in FIG. 1, and the detailed explanation is omitted. This laser has a mesa-shaped ridge 8 so that the current blocking layer 11 can be grown on both sides of the ridge 8 continuously and smoothly. The same type of laser is described in the patent already described.

For example, the ridge stripe laser formed on the (100) GaAs substrate 1 has the mesa-shape ridge stripe 8 by the wet etching, as shown in FIG. 5.

However the wet-etching has disadvantages such as the poor controllability of the stripe width by the side etching effect and the reproducibility.

Consequently the higher laser resistance occurs, the variations of the electrical and the optical characteristic expand and the production yield becomes poor.

Another disadvantage relates to off-angle surface of the GaAs substrate. In general, the off-angle substrate is used because the substrate like off-angled from (100) surface makes it easy to grow the crystal layer with the appropriate step on the atomic surface. Therefore the fundamental characteristic like the maximum temperature of the oscillation and the temperature characteristic are improved so much.

Figure 6:
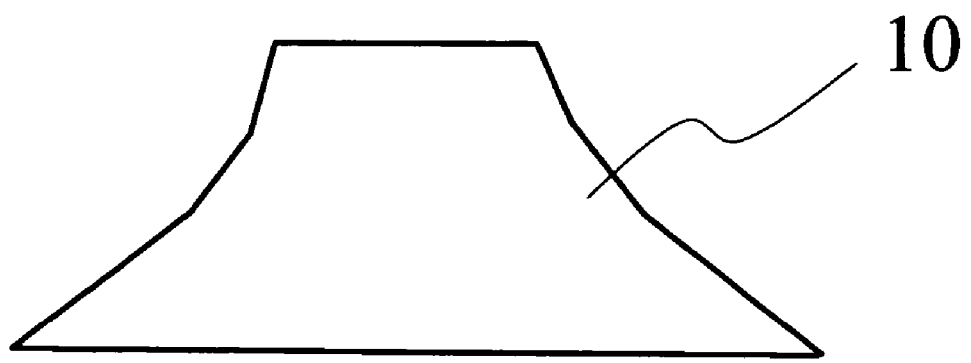
FIG. 6 is a cross-sectional view showing asymmetric ridge side surface in a case of grown on an off-angle substrate.
Figure 6:
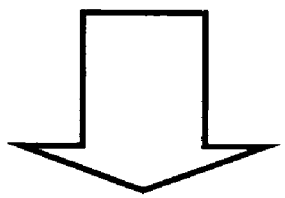
Figure 6:
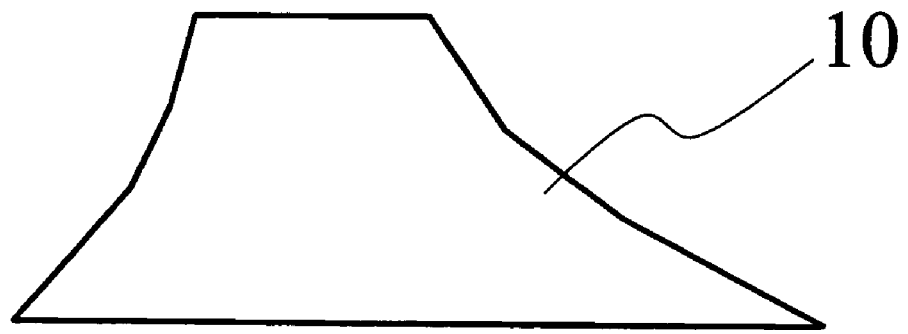

However, when the ridge stripe laser is manufactured using such off-angle substrate and the wet etching, the inclination of the side surfaces becomes asymmetric on either side as shown in FIG. 6.

On the contrast, according to a first embodiment, the ridge stripe can be formed with the excellent controllability by RIE, even in a case of off-angle substrate. And since the current blocking layer can be grown without the defect region and the voids due to the lower inclining portion, the excellent electrical and optical characteristic is achieved without the serious problems like the leak current and asymmetric optical pattern.

(Second Embodiment)

Next, a second embodiment of this invention is explained hereinafter.

FIG. 7 is a cross-sectional view of the semiconductor laser device according to a second embodiment. This semiconductor laser device comprises two self-sustained pulsation lasers having the 650 and 780 nm wavelength, respectively, on 10–15° off same GaAs substrate.

On an n-type 10–15° off-angled GaAs substrate 1, the laser element regions A and B are formed, respectively. In the laser regions A and B, an n-type InGaAlP cladding layer 2, an active layer (4A for 650 nm and 4B for 790 nm), a p-type upper first cladding layer 6 of InGaAlP, and a p-type etching stop layer 7 of InGaP are formed, respectively.

The second cladding layer 8 is composed of a upper portion 10b having vertical sidewalls and a lower portion 10a widening toward the active layer (4A and 4B) on the etching stop layer 7. An n-type GaAs current blocking layer 11 is formed on both sides of the ridge stripe 10, and then a p-type GaAs contact layer 12 covers both regions.

An n-side electrode 13 is formed on the backside of the substrate 1, and a p-side electrode 14 is formed on the contact layer 12.

Thus, a two-wavelength laser is integrated on the off-angled GaAs substrate 1, by using the ridge stripe structure comprising the upper portion 10b having the vertical walls and the lower portion 10a widening toward the active layer.

The oscillation mechanism, the structure and the features of self-sustained pulsation laser are described hereinafter.

The conventional technique to minimize the laser noise induced by the optical feedback is to apply the high-frequency signal superimposed driving current to the laser. However this technique has the several disadvantages. One is the consumption power increase by the high-frequency superimposing circuit. The other is an EMI problem which makes it impossible to achieve the small size and the resin optical drive package. The advantage of the self-sustained pulsation laser is to achieve the low noise characteristic under the feedback light of the actual optical disk equipment without the high-frequency superimposition.

The self-sustained pulsation semiconductor laser generates the self-sustained pulsation by the electrical and optical interaction between an active lasing region and an absorption region. The fundamental characteristics, such as a pulsation starting current and the sustaining ability dependency on the operation current, are very sensitive to the structure and the size of the active region and the absorption region. Therefore in order to obtain the stable self-sustained pulsation, the strict control of the structural parameters, such as the width of the ridge stripe and each layer thickness, is very important.

Since it become possible to etch InGaAlP vertically by using RIE with the chlorine based gas, a mask pattern dimension is realized on the semiconductor layers accurately without the side etching. In a case of the semiconductor laser the ridge stripe width is obtained accurately according to the mask dimension even if the InGaAlP layer is grown on the off-angled GaAs substrate.

The manufacturing method of the integrated two-wavelength laser is disclosed in Japanese Patent Application Laid-Open No. 2000-11417, for example.

In using off-angle substrate, the fundamental method described in above application is still applicable by changing the crystal growth and process conditions slightly.

An InGaP based MQW active layer 4A is preferable for the 650 nm wavelength laser for DVDs and an AlGaAs based MQW active layer 4B is preferable for 780 nm wavelength laser for CDs (compact discs). The active layer structure is not limited to the above structure.

In this second embodiment, the ridge stripe 10 can be formed by the same method as the first embodiment, as shown in FIGS. 2A through 4D.

A mechanism of the self-sustained pulsation is further explained hereinafter. In order to generate self-sustained pulsation, the semiconductor laser has to comprise the saturable absorber region. Due to the lower portion 10a, the lateral mode of the laser spreads toward the outward direction along the active layers 300(350) and the saturable absorption regions 310(360) is formed in both outer regions of the active region 310(360).

In FIG. 7, the shapes of the active regions and the absorption regions show only the positions and the dimensions approximately, but not quantitatively.

In this structure which comprises the saturable absorption regions 310 and 360, the optimum range of the structural parameter for self-sustained pulsation is narrow but the temperature characteristics is excellent as compared with the structure which comprises the saturable absorption layer in the other position.

As an example of the self-sustained pulsation characteristic of the laser according to a second embodiment, the laser with an oscillation wavelength of 790 nm formed in the element region B in FIG. 7A will be explained hereafter.

Figure 8:
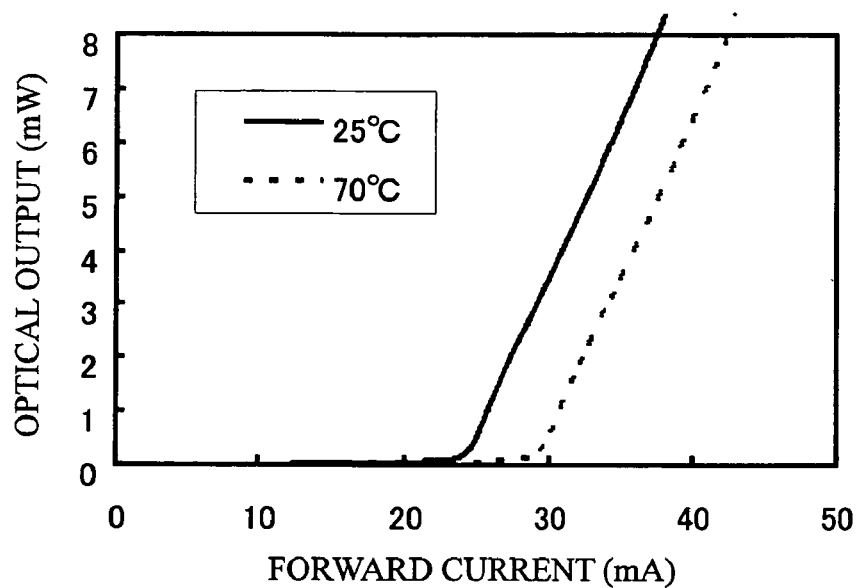
FIG. 8 shows the current-optical output power characteristic of the laser according to the second embodiment of the invention.

FIG. 8 is a graphical representation showing the current-optical output characteristic of this laser. It turns out that the slope efficiency is almost same between 25 and 70° C. (degrees centigrade).

Figure 9:
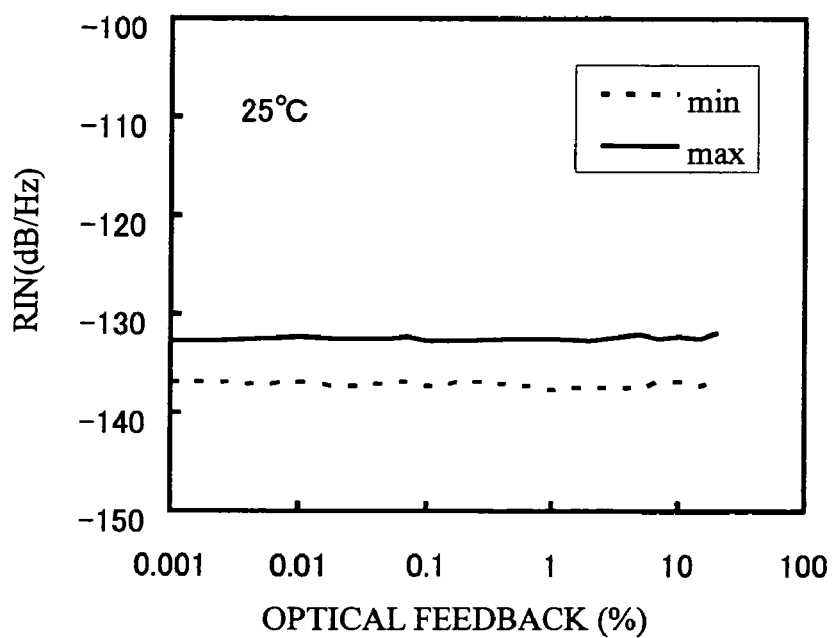
FIG. 9 shows the feedback light-RIN characteristic of the laser according to the second embodiment at a room temperature.

FIG. 9 is a graphical representation showing the experimental result of the relative noise intensity RIN (relative intensity noise) versus optical feedback. This measurement is carried out at 4 mW of the output at 25° C. It turns out that a noise level does not rise even if the optical feedback increases.

Figure 10:
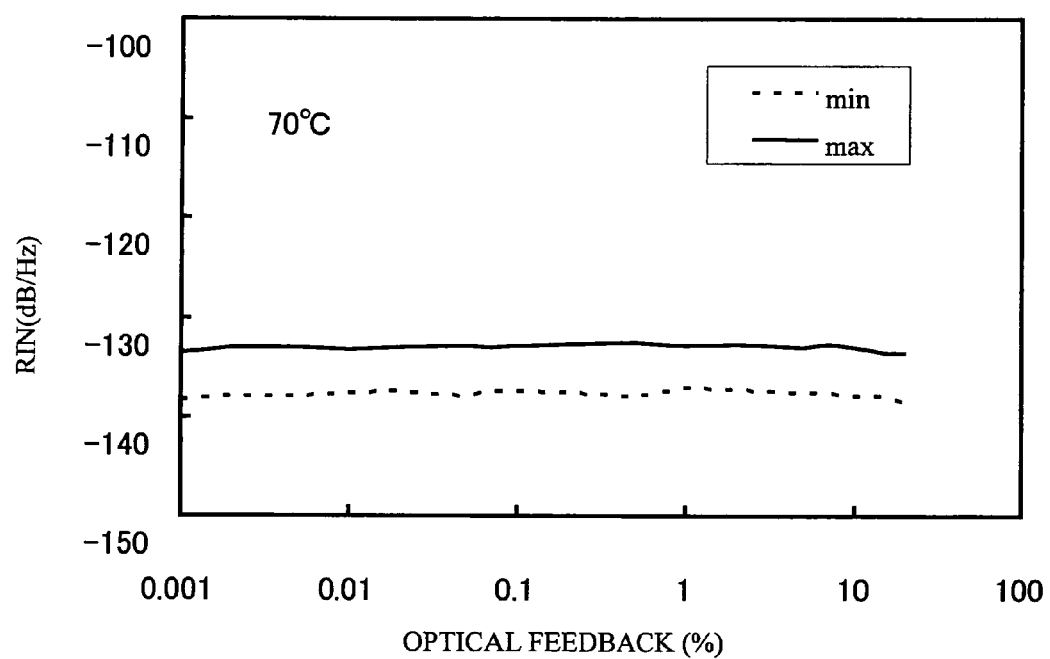
FIG. 10 shows the feedback light-RIN characteristic of the laser according to a second embodiment at 70° C.

FIG. 10 is a graphical representation showing the measurement result of RIN at 70° C. of the same laser. It turns out that a noise level does not rise like the case of 25° C. even if the feedback light increases. An optical pickup head using this laser can read out the CD and CD-ROM signal very stably over the wide temperature ranges and under the optical feedback condition, because of the high S/N ratio.

Figure 11A:
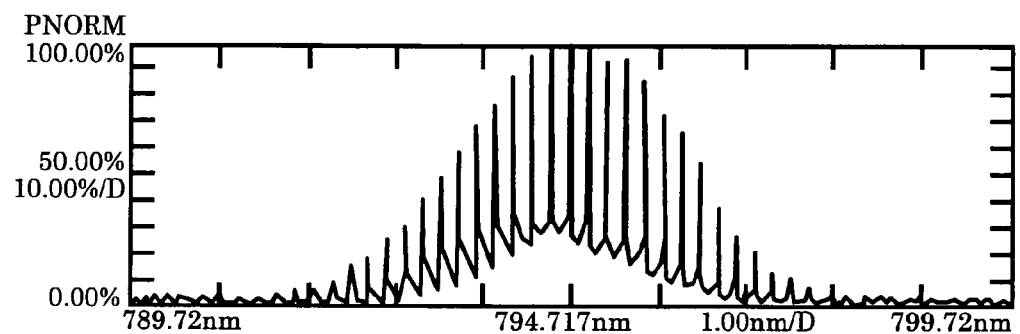
FIG. 11A is a graph showing an oscillation spectrum.
Figure 11B:
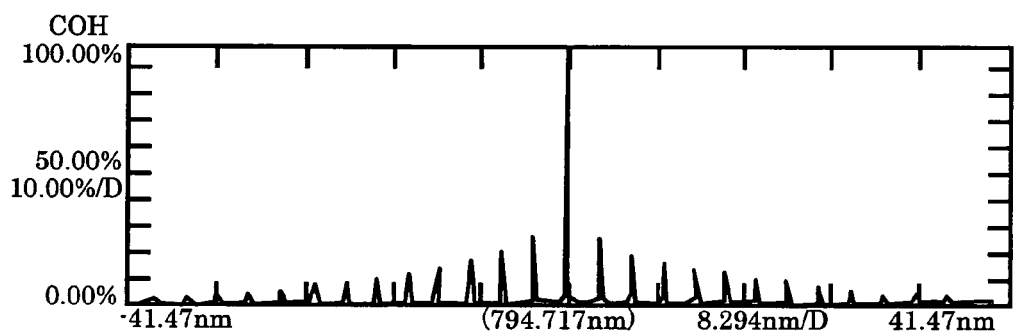
FIG. 11B is a graph showing a coherency measurement result.

FIG. 11A is a graphical representation showing an oscillation spectrum. FIG. 11B is a graphical representation showing the visibility (γ) measurement result. These measurements are carried out at 4 mW of the outputs at 25° C.

The peak P1 of the center of the graph expresses the interference light intensity which superimposes the light of no phase difference. The peaks P2 and P3 express the interference light intensity which superimpose the lights between which the phase difference is ±2π.

A degree of the interference can be expressed by using a parameter γ which can be defined as follows:

$$\gamma = (P2 + P3)/2 \times P1$$

In a case where γ=1, a light is completely coherent and in a case where γ=0, a light is incoherent. γ of the laser is desirable to be within the range of tens to 80% in the optical disk application.

FIG. 11A shows the typical oscillation spectrum of the self-sustained pulsation laser.

FIG. 11B shows that gamma is about 25%, relatively low.

That is, the maximum RIN of this laser is less than −130 dB/Hz, and the coherency is 25%. These performances are sufficient for CDs. Furthermore, according to the result of a trial production by the Inventors, the production yield of the chip is almost 100% and the fall of the yield by the variation of the width of the ridge stripe is almost zero.

As a result of examination of the off angle magnitude of the GaAs substrate 1, the excellent performance and good reproducibility are achieved within the range of 5 to 35°, more preferably 10–15°.

The characteristic required for the DVDs is satisfied also with the 650 nm wavelength laser in the same manner.

Figure 7A:
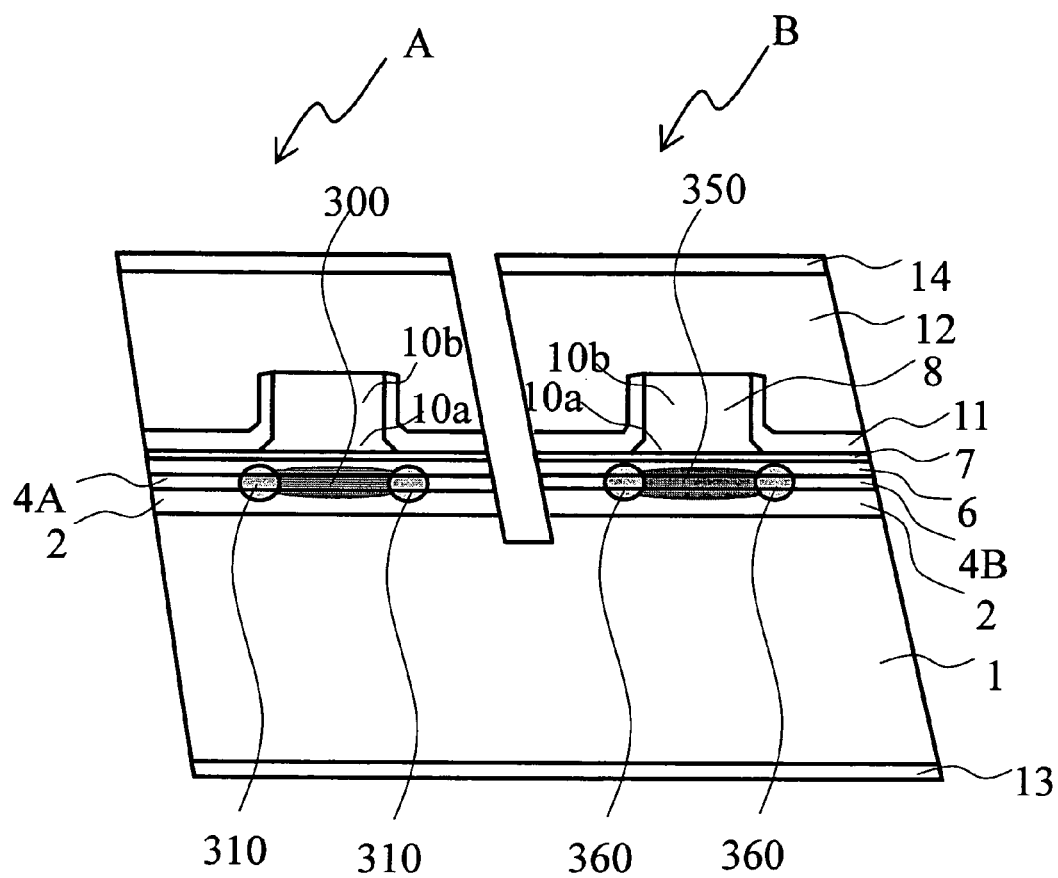
FIG. 7A is a cross-sectional view of the semiconductor laser device according to a second embodiment of the invention.
Figure 7B:
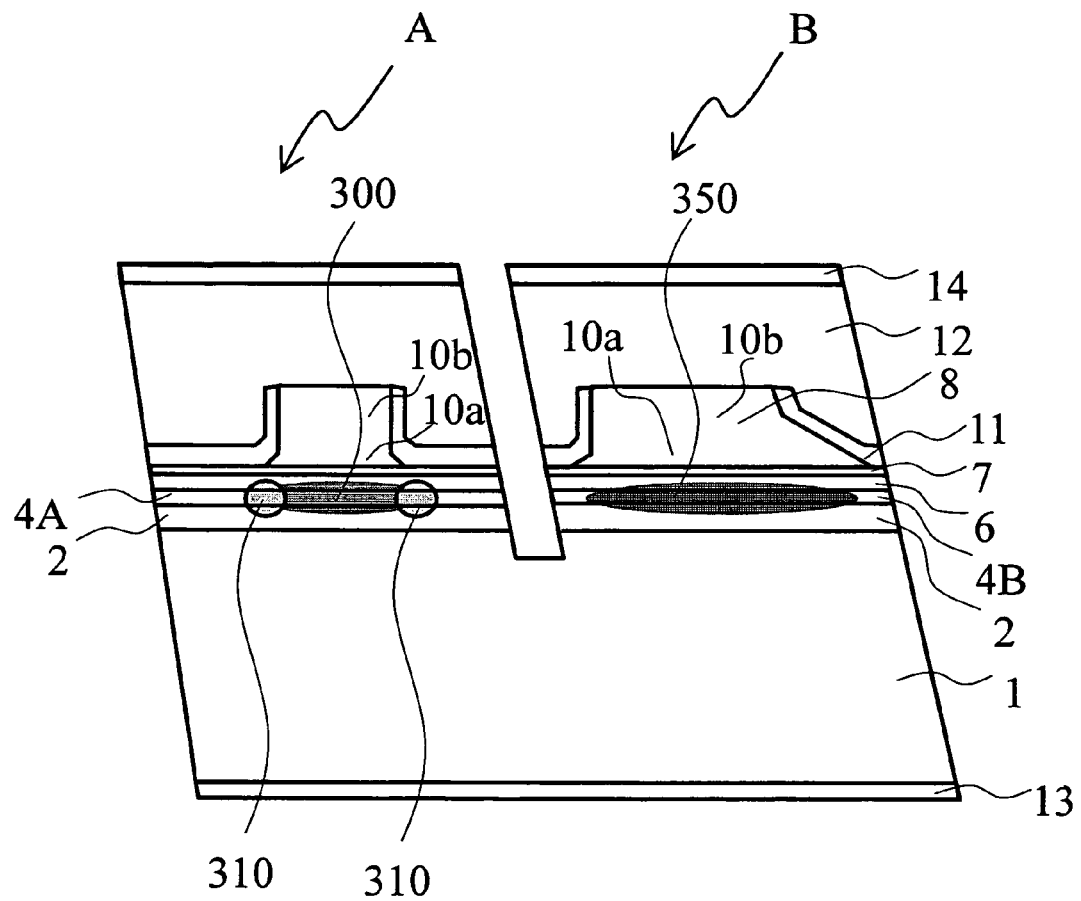
FIG. 7B is a cross-sectional view of a modified laser device and FIG. 7C shows a multi-longitudinal mode spectrum.
Figure 7C:
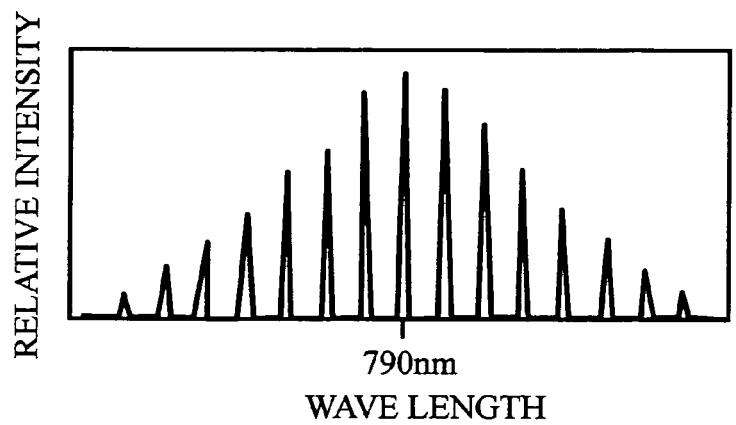

FIG. 7A shows that both laser elements (A and B) have the almost same cross-sections of the ridge. Therefore both elements generate the self-sustained pulsation. Advantages of this are already described. However, in a case of CD player, the specification for RIN is not so tight as compared with DVDs and hence the multi-longitudinal mode laser can be used sometimes. FIG. 7B shows the cross-sectional view of such an integrated laser. The element B (right side) is of a type of gain-guided laser having a relatively wide stripe width and the center wavelength of 790 nm. FIG. 7C shows its multi-longitudinal mode spectrum.

(Third Embodiment)

Another multi-wavelength integrated semiconductor laser is explained as a third embodiment hereinafter.

Figure 12:
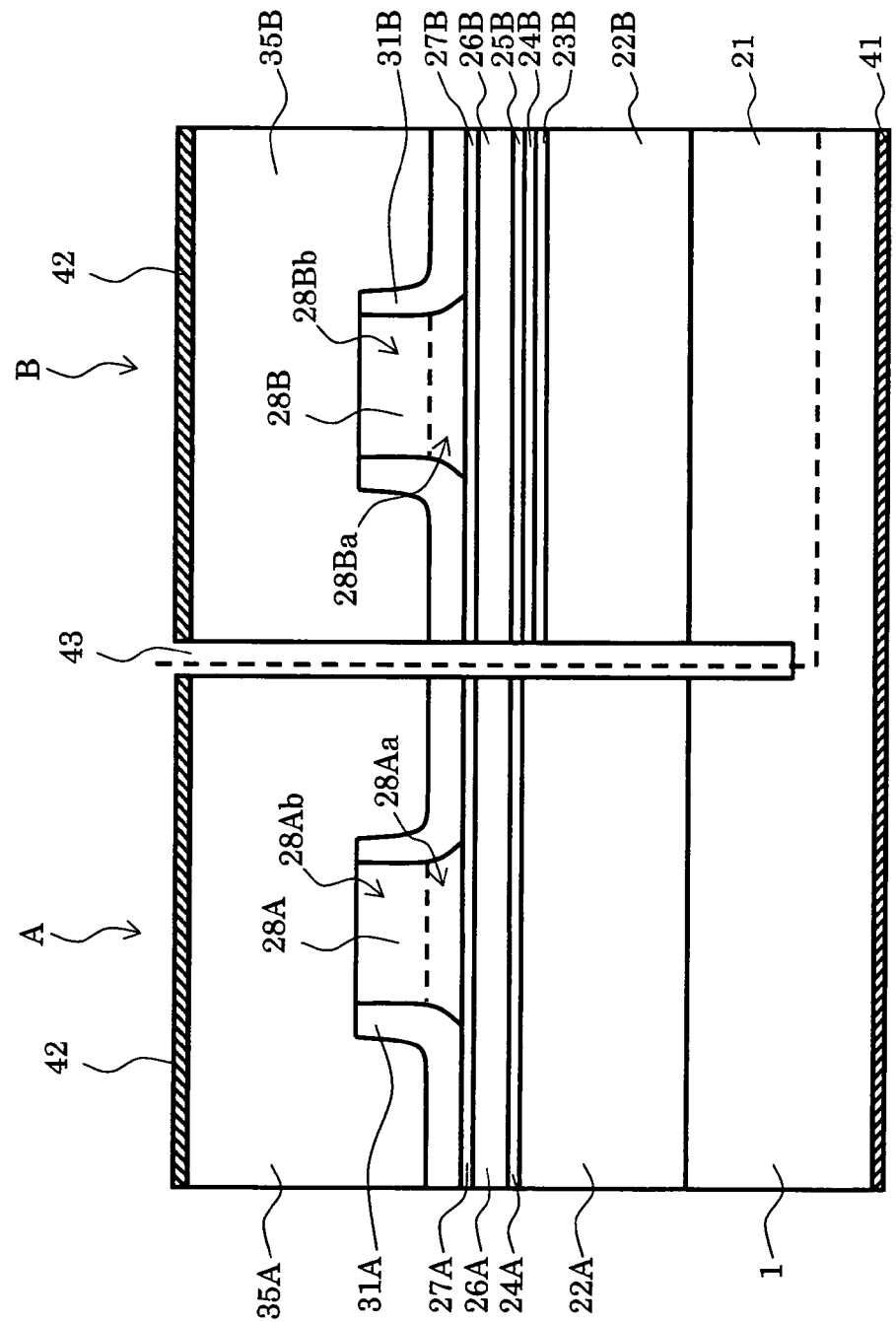
FIG. 12 is a cross-sectional view of the two-wavelength integrated semiconductor laser according to a third embodiment of the invention.

FIG. 12 shows a cross-sectional view of another two-wavelength integrated semiconductor laser perpendicular to the laser resonance axis.

Also in this embodiment, the first laser A and the second laser B are integrated on the substrate 1.

The ridge stripes 28A and 28B of these lasers comprise the lower portion and the upper portion, as shown in FIG. 12. By using this structure, the self-sustained pulsation is attained over the wide output power range of 3–6 mW and at the relatively high output power level like 6 mW.

Hereafter, the structure is explained in detail, referring to the drawing.

This two-wavelength integrated semiconductor laser comprises an AlGaAs based laser A having an AlGaAs active layer 24A (as shown in the left portion of FIG. 12) and an InGaAlP based laser B having an InGaAlP active layer 24B (as shown in the right portion of FIG. 12).

The element A is the semiconductor laser of the 780 nm wavelength for CDs, and the element B is the semiconductor laser of the 650 nm wavelength for DVDs.

Actually the 780 nm laser has the wavelength range of 770 to 790 nm and the 650 nm laser has the wavelength range of 630 to 700 nm, respectively.

In a case of the laser element A, an n-type cladding layer 22A of $In_{0.5}(Ga_{0.3}Al_{0.7})_{0.5}P$, a single active layer 24A of the 50 nm-thick $Al_{0.12}Ga_{0.88}As$, a p-type first cladding layer 26A of the 0.35 µm-thick $In_{0.5}(Ga_{0.3}Al_{0.7})_{0.5}P$ and an etching stop layer 27A are grown sequentially on the n-type GaAs substrate 1.

On the etching stop layer 27A, a p-type second cladding layer having the ridge stripe 28A is formed along the laser cavity direction. This ridge stripe 28A comprises a lower portion 28Aa widening toward an active layer and an upper portion 28Ab having vertical sidewalls.

Whereas the sidewalls of the upper portion of 28Ab intersect the surface of the substrate 1 approximately vertically, a tangent plane of the lower portion 28Aa intersects the surface of the substrate 1 at an angle of less than 80°. A total thickness of the ridge stripe 28A is approximately 1 µm so that the laser light is confined effectively in the active layer 24A. The n-type current blocking layer 31A of InAlP is formed on both sides of ridge stripe 28A and a p-type contact layer of GaAs 35A is grown thereon.

On the other hand, in a case of the laser element B, a buffer layer 21 of an n-type GaAs, a n-type cladding layer 22B of $In_{0.5}(Ga_{0.3}Al_{0.7})_{0.5}P$, an n-side guide layer 23B of $In_{0.5}(Ga_{0.5}Al_{0.5})_{0.5}P$, and an activity layer 24B of $In_{0.5}(Ga_{1-u}Al_u)_{0.5}P$ (where $0 \leq u \leq 0.2$) are formed sequentially on the n-type GaAs substrate 1. This active layer 24B is of a MQW (Multiple Quantum Well) structure having seven alternate layers of 6 nm-thick well layer of InGaP and 6 nm-thick barrier layer of InGaAlP. A p-side guide layer 25B of $In_{0.5}(Ga_{0.5}Al_{0.5})_{0.5}P$, a 0.35-µm-thick p-type first cladding 26B of $In_{0.5}(Ga_{0.3}Al_{0.7})_{0.5}P$ and an etching-stopping layer 27B of p-type $In_{0.5}Ga_{0.5}P$ are formed on the active layer 24B. A p-type second cladding layer (ridge portion) 28B is formed on the etching stop layer 27B. This ridge portion 28B is formed of an $In_{0.5}(Ga_{0.3}Al_{0.7})_{0.5}P$ compound material of the same composition of the ridge portion 28A of the AlGaAs laser element A on the left side of figure. The shape of this ridge portion 28B is the same as that of the ridge portion 28A of the AlGaAs laser element A on the left side of the figure.

A current blocking layer 31B and a p-type contact layer 35B are in common with those of the laser element A for CDs on the left side of figure.

A separation groove 43 is formed between the element B on the right side of the figure and the element A on the left side of the figure.

The currents are injected into the active layer 24A of the laser element A on the left side of the figure, from an n-side electrode 41 on the lower side in the figure and a p-side electrode 42 on the upper side thereof. The operation currents from the p-side electrode 42 do not flow into the current blocking layer 31A and thus are concentrated in the ridge portion 28A. The 780 nm light is emitted from an excited region in the active layer 24A below the ridge portion 28A into the direction perpendicular to the plane of the paper. This light is amplified to form the laser light of the 780 nm wavelength.

The 650 nm laser light, also, is emitted from an excited region in the active layer 24B below the ridge portion 28B into the direction perpendicular to the plane of the drawing.

Note that the thickness of the substrate 1 of the element A of FIG. 12 is approximately 100 µm and the thickness of the stack of layers 22A to 35A is a few µm, but these layers are not shown to scale in the elements A and B, in order to facilitate the description.

One of the features of the semiconductor laser device shown in FIG. 12 is that the lower bottom width of the lower portion 28Aa is 4.0 µm and the width of the upper portion 28Ab is 3.2 µm. Side walls of the inclining portion 28Aa and 28Ba intersect the surface plane of substrate 1 at angle of less than 80°, respectively.

As described later, the lower portion 28Aa and 28Ba are formed by wet etching technique, whereas the upper portion 28Ab and 28Bb are formed by dry etching technique.

The thickness (height) of the ridge portions 28A and 28B is about 1 µm.

According to the third embodiment, it becomes possible to obtain self-sustained pulsation up to a high output on the order of 6 mW, enabling self-sustained pulsation within a wide region on the order of 3 to 6 mW.

The Inventors consider the reason why the self-sustained pulsation becomes possible over such wider output power range, as follows:

Since the ridge stripes 28A and 28B comprise the upper portion (28Ab and 28Bb) and the lower portion (28Aa and 28Ba), the current injected from the p-side electrode 42 diverge downward uniformly along the inclining surfaces of the lower portion under the ridge stripes 28A and 28B. Therefore, the higher gain regions spread and the absorbed regions narrow in the active layer 24A and 24B. Since the gain regions spread broadly, the gain peak intensity decreases much. Thus, because of the decrease in the gain peak intensity decreases, the effects of absorption in the active layers 24A and 24B below the current blocking layers 31A and 31B increase relatively. As the absorption effect becomes higher, the self-sustained pulsation occurs more easily, as already explained. As a result, the self-sustained pulsation can be obtained over the wide output range.

Those skilled in the art do not consider that the self-sustained pulsation laser should comprise the upper portion with the vertical walls and the lower portion widening downward in the ridge stripe, because the wider ridge stripes of 28A and 28B result the wider active layer and hence poor self-sustained pulsation, and the dry etching technique for forming the vertical walls on both sides of the ridge stripe causes the side surface degradation of the ridge stripe 28A and 28B.

In contrast, the Inventors have overturned conventional technological wisdom and have independently found that it is possible to facilitate the self-sustained pulsation by providing the ridge stripe 28A and 28B which comprises the upper portion with the vertical walls and the lower portion widening downward. The Inventors have calculated that the advantage of weakening the gain peak intensity is greater than the disadvantage of increasing the higher gain regions in the active layers 24A and 24B in which the gain is high, so that the absorption effect of the active layers 24A and 24B below the current blocking layers 31A and 31B is increased relatively.

The Inventors have also calculated that the above-described advantage is greater than the disadvantage due to deterioration of the crystallinity of the ridge portion 28A and 28B.

Figure 13A:
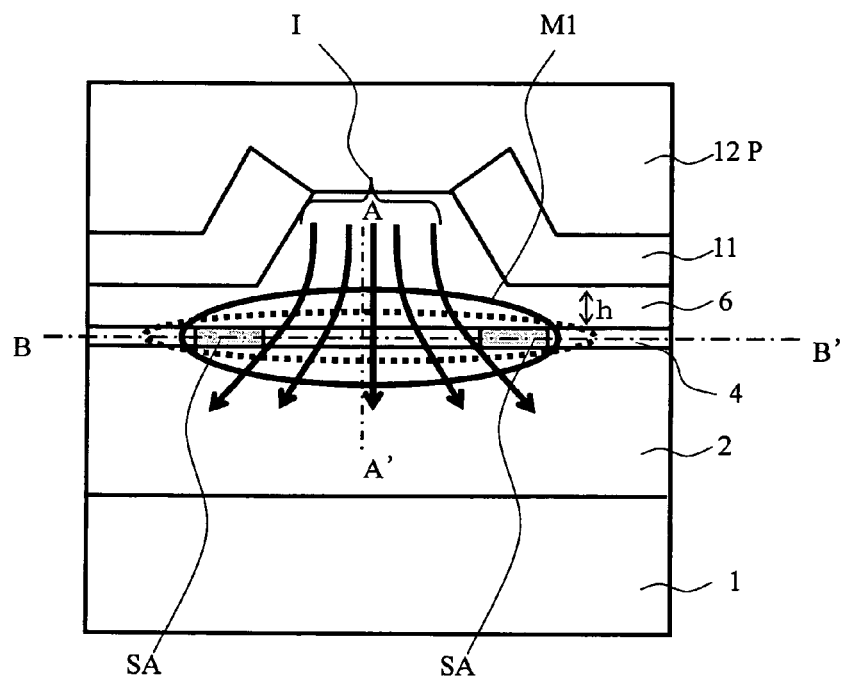
FIGS. 13A through 13C are diagrams for an explanation of self-sustained pulsation mechanism.

The self-sustained pulsation mechanism is described more precisely hereinafter. The self-sustained pulsation laser requires the saturable absorber in the vicinity of the active layer. As illustrated in FIG. 13A, when the thickness h of the p-type cladding layer 6 is relatively thick and the active layer 4 is also relatively thick, the guided laser light propagating in the active layer spreads outwards along active layer surface. On the other hand, the injected current I from the p-type contact layer 12 is confined by the n-type current blocking layer 11, and does not flow outward apart from the ridge stripe. The region where the current flows under the current blocking layer 11 is determined by the carrier concentration of the p-type cladding layer and the shape of the ridge stripe. If the ridge stripe shape and width are designed appropriately, there exists a region where the laser light propagates but the current does not flow. This is an optical absorption region where the carriers are excited by the light absorption. When the carriers are excited up to the upper limit, the optical absorptions is saturated and this region acts as the saturable absorber SA.

Figure 13B:
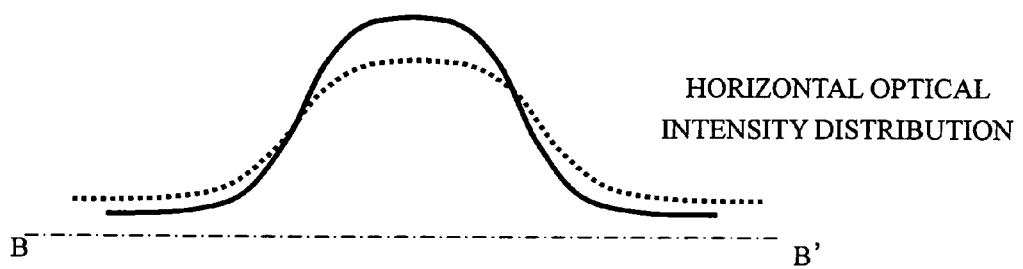
Figure 13C:
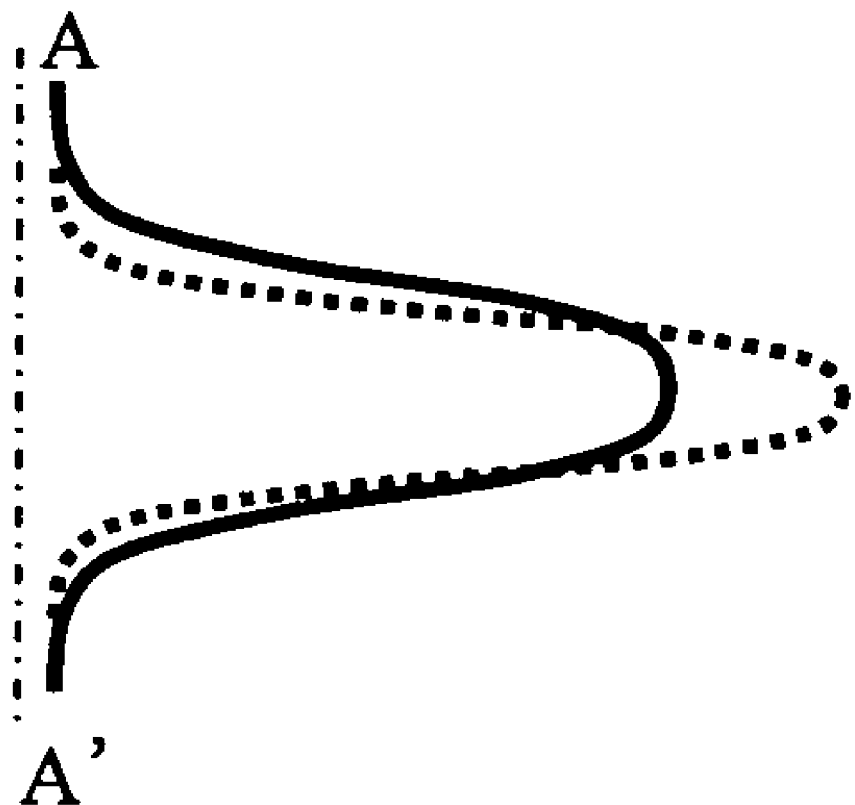

It is understood that when a laser light spreads more outward along active layer surface, a volume of the saturable absorber SA becomes larger and hence the self-sustained pulsation occurs more easily, as shown in FIGS. 13A through 13C, where the broken line shows more divergent light emitting region and its light intensity.

If the volume of the saturable absorber SA becomes too large, the operation current increases and it is not preferable for the application of the optical pick-up head. Therefore, the optimum volume of the saturable absorber SA has to be designed.

If the active layer 4 becomes thicker and the height h becomes higher, the volume of the saturable absorber SA becomes larger but the operation current increases.

If the ridge width becomes narrower, the volume of the saturable absorber SA becomes large but the operation voltage $V_{op}$ increases. The appropriate saturable absorber volume and its shape have to be appropriately designed by taking these relations into account. In a real refractive-index laser which has the wider band-gap current blocking layer than the active layer, a guided laser light spreads outward much more widely because of less optical absorption in the current blocking layer as compared with a complex refractive-index laser which has the narrower band-gap current blocking layer than the active layer. The real refractive-index laser having the thinner active layer and the smaller height (h) can provide enough volume for self-sustained pulsation as compared with the complex refractive-index laser.

In order to realize above structure there are several problems. First, when the ridge shape becomes rectangle-fashion and the ridge sidewalls surface plane intersects the substrate surface at the steeper angle, the current blocking layer 11 can not be grown smoothly and contains defect region, as described above. Secondly, when the ridge side surface plane intersects the substrate surface at the smaller angle, the current blocking layer can be grown without the defects but the width of the upper ridge becomes narrower almost to 1 μm to obtain the lower ridge stripe width of 2–5 μm necessary for the self-sustained pulsation, resulting in the higher operation current.

Thus, it becomes difficult to obtain the excellent real refractive-index laser by the real refractive-index structure.

According to the invention, the self-sustained pulsation laser using the real refractive-index structure is obtained for the first time. Since this laser comprises the upper ridge portion with both the vertical walls and the lower portion widening downward, the excellent self-sustained pulsation and the low current operation are achieved.

This laser is expected to have a lifetime as long as that of the conventional laser. This is because the current density in the ridge stripe becomes lower due to the wider upper ridge stripe 28A and 28B.

The ridge stripe 28A of AlGaAs laser (shown in the left portion of FIG. 12) is composed of the same material of $In_{0.5}(Ga_{0.3}Al_{0.7})_{0.5}P$ as the ridge stripe 28B of InGaAlP laser (shown in the right portion of FIG. 12). A current blocking layer 31A and a p-type contact layer 35A are also the same as that of the semiconductor laser element B of the InGaAlP of the right-hand side in common. For this reason, the fabrication process after formation of the ridge stripe 28A and 28B, the current blocking layers 31A and 31B, and a p-type contact layers 35A and 35B can be simultaneously performed for the elements A and B on either side. Thereby, a manufacturing process can be simplified and the higher productivity and the higher production yield are achieved.

Figure 14:
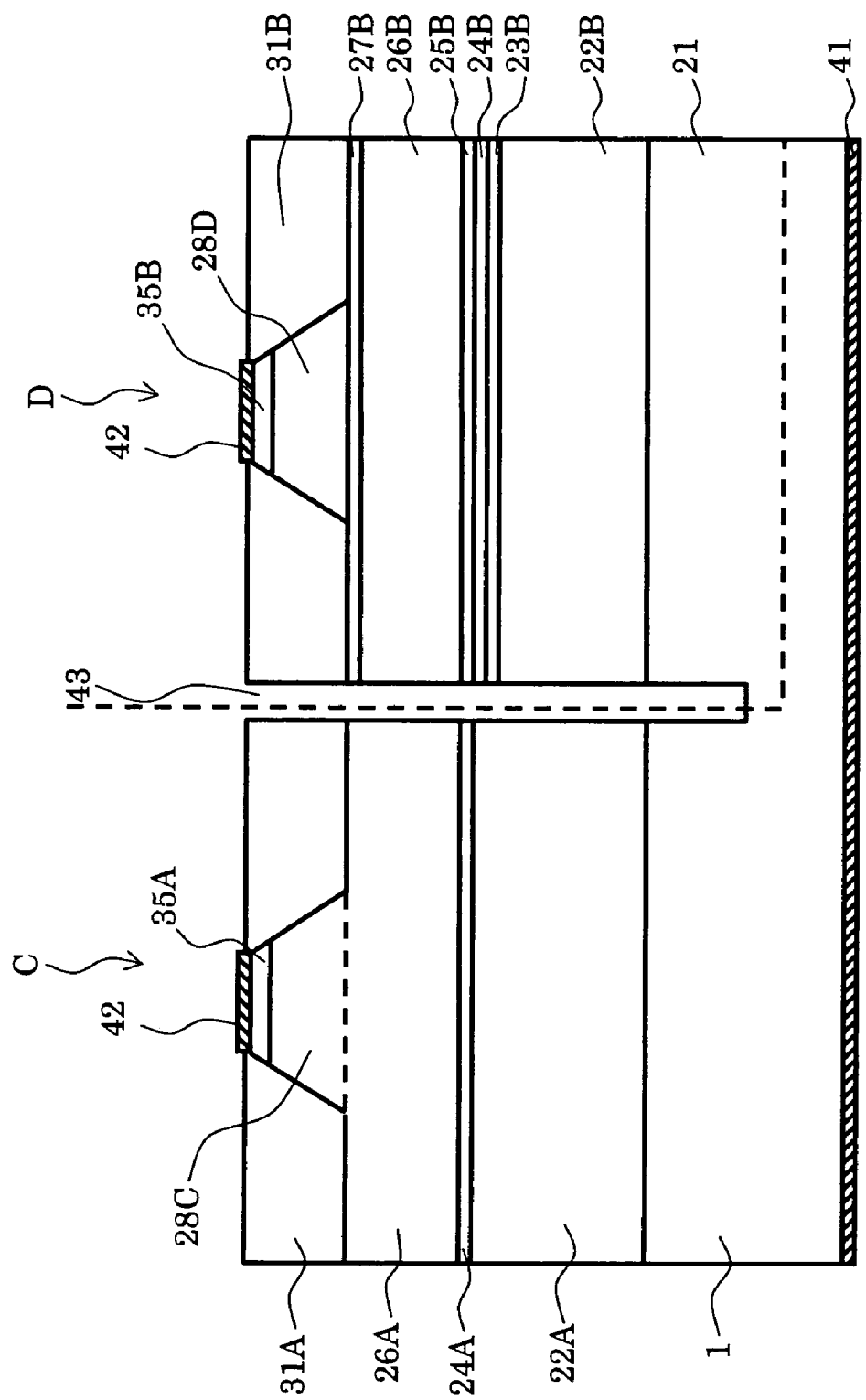
FIG. 14 is a cross-sectional view of the laser device of a comparative example.
Figure 15:
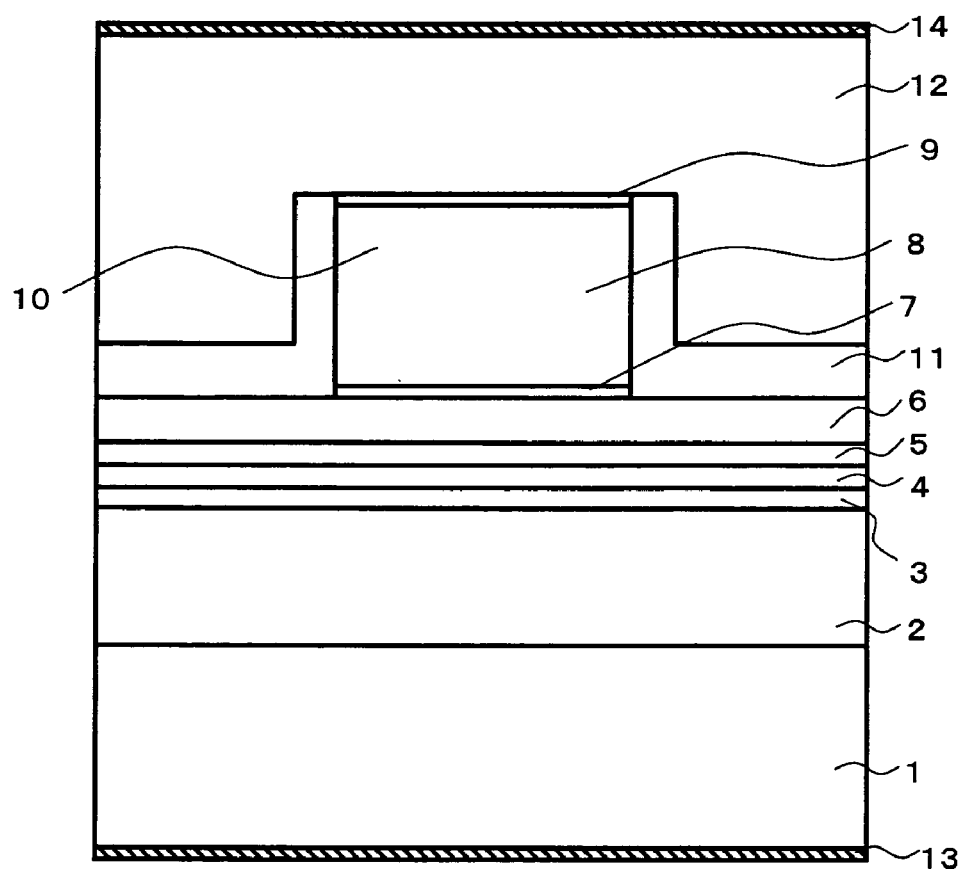
FIG. 15 is a cross-sectional view of ridge wave guide semiconductor laser device.

FIG. 14 is a cross-sectional view of comparative laser device. About this figure, the same reference numerals are given to the same elements as what are shown in FIG. 12, and the detailed explanation is omitted.

As for the laser device of this comparative example, the laser element C and the laser element D are integrated on the GaAs substrate 1. The laser element C is an AlGaAs based semiconductor laser, and, on the whole, the ridge portion 28C has the inclining side surface which inclines to the main surface of the substrate 1.

The AlGaAs base material, such as $Al_{0.4}Ga_{0.6}As$, is used for this ridge portion 28C for the following reason: It has been believed that when the ridge portion 28C is composed of the higher aluminum constitution material such as $In_{0.5}(Ga_{0.3}Al_{0.7})_{0.5}P$ (shown in FIG. 12), the band-gap difference and the refractive-index difference between the ridge portion 28C and a active layer 24A become too large. Consequently, the mode may become unstable and the self-sustained pulsation tends to stop.

However, the element A in FIG. 12 has an excellent self-sustained pulsation characteristic regardless of the ridge with the higher aluminum constitution material. The structure shown in FIG. 12 will be explained hereinafter.

Since the active layer 24A has relatively thick 50 nm layer in AlGaAs laser element A shown in FIG. 12, the guided wave is easily confined in the active layer 24A, the absorption occurs easily and hence the self-sustaining oscillation occurs easily. Since the active layer 24B has relatively thick 36 nm well totally in InGaAlP laser element B in FIG. 12, the guided wave is easily confined in the active layer 24B, the absorption occurs easily and hence the self-sustained pulsation occurs easily.

Next, the shape of the ridge stripe 28A and 28B of the laser device of FIG. 12 will be explained. As shown in FIG. 12, the ridge stripe 28A and 28B have the shape of 1.0 µm-thick, 4.0 µm-wide at the lower portion edge, and 3.2 µm-wide at the upper portion edge. However, the invention is not limited in this specific example. Other structural parameters are possible, as described below.

By a result of the examination by the Inventors, it was found that a minimum width at the lower portion edge (bottom) may preferably be 1.5 µm in order to obtain the self-sustained oscillation easily. In a case where the width is less than 1.5 µm, the currents are concentrated in the central portion of the active layers 24A and 24B and it becomes difficult to obtain the effect of this invention.

On the other hand, a maximum width of the lower portion edge (bottom) may preferably be 5.0 µm, because the higher oscillation modes tend to occur in a case where the width is larger than 5.0 µm. When the ridge stripe comprises the upper portion with vertical walls and the lower portion widening downward of which the bottom width is less than 5.0 µm, the currents flow uniformly in the ridge stripe 28A and 28B and hence higher modes hardly occur, as compared with the comparative laser shown in FIG. 14. Consequently, it is concluded that the optimum bottom width of the lower portion may preferably be within the range of 1.5–5.0 µm, more preferably be within the range of 3.0–5.0 µm.

Also the optimum thickness of the ridge stripe 28A and 28B may preferably be within the range of 0.7–1.4 µm.

As explained above, according to this embodiment, the multi-wavelength integrated laser device which can produce the stable self-sustained pulsation like the second embodiment can be realized. According to the second and third embodiments of the invention, a multi-wavelength integrated laser device can be realized for the high density optical disk drive such as DVDs. Hereafter, this technical significance is explained.

Since the latest optical disc drive is required to read out both DVDs and CDs, an optical pick-up needs two different wavelength lasers. However, in order to achieve a small size, simple structure and low cost pick-up, a two-wavelength integrated laser is required.

However, in order to realize such a laser, there were the following problems conventionally. The two-wavelength integrated laser is classified in general into two types.

One is a two-wavelength integrated laser of which the spectrums are single mode. This laser comprises a bulk active layer of AlGaAs for CDs and a MQW active layer of InGaP/InGaAlP for DVDs, each ridge stripe of a p-type cladding layer of same InGaAlP formed by the wet etching and each current blocking layer of same n-type GaAs.

When this single mode laser is used, it is required to shift the spectrum to multi-mode and to decrease the coherency by superimposing a high-frequency to a driving dc current, in order to reduce the RIN induced by optical feedback. However, this high frequency superimposition may cause an unnecessary electromagnetic irradiation. In order to shield this unnecessary irradiation, an expensive metallic package is needed.

The other is the integrated laser of a multi-mode laser for CDs having ion-implanted current blocking layer, and a self-sustained pulsation laser for DVDs having a silicon dioxide current blocking layer and an inclining ridge by wet etching. This laser has a disadvantage in an application that the laser driving circuit design becomes difficult because of the higher operation current. Also this laser has a disadvantage that a distance between the two light emitting spot is not necessarily obtained with good reproducibility due to the fabrication process including two separate photolithography steps, and hence the optical assembly becomes difficult.

On the contrast, according to the third embodiment, the two-wavelength integrated laser for the optical pick-up head is obtained. Since this laser can generate the self-sustained oscillation appropriately, the excellent noise characteristic is achieved without the external high-frequency circuit. Also since this laser have a real refractive-index structure using the current blocking layer of InAlP, the optical loss can be reduced and the driving circuit design becomes easy due to the reduced operation current. As a result, a manufacturing cost can be reduced and a low cost and high performance optical pickup can be obtained. Since the high frequency superimposition is unnecessary, it becomes possible to use the resin packages of the optical pickup and the drive equipment, and the cost reduction is achieved.

Additional advantages and modifications will readily occur to those skilled in the art. More specifically as a material which constitutes the semiconductor laser device of this invention, various kinds of material, such as AlGaAs, InP, and GaN can be used instead of InGaAlP.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor laser device comprising:
an AlGaAs based laser element monolithically formed on a substrate; and
an InGaAlP based laser element monolithically formed on the substrate,
a wavelength of a laser light emitted from the AlGaAs based laser element and a wavelength of a laser light emitted from the InGaAlP based laser element being different,
the AlGaAs based laser element having:
  a first cladding layer of a first conductivity type;
  a first active layer provided on the first cladding layer, and including $Al_y Ga_{1-y} A_s$ ($0 \leq y \leq 0.2$):
  a second cladding layer of a second conductivity type provided on the first active layer; and
  a third cladding layer of a second conductivity type provided on the second cladding layer, the third cladding layer being made of $In_{0.5}(Ga_{1-x}Al_x)_{0.5}P$, and at least a part of the third cladding layer having a ridge stripe including:
    a first upper portion having vertical sidewalls; and
    a first lower portion having sidewalls inclined so that the stripe becomes wider toward the first active layer, and
the InGaAlP based laser element having:
  a fourth cladding layer of a first conductivity type;
  a second active layer provided on the fourth cladding layer, and including $In_{0.5}(Ga_{1-u}Al_u)_{0.5}P$ ($0 \leq u \leq 0.2$);
  a fifth cladding layer of a second conductivity type provided on the second active layer; and a sixth cladding layer of a second conductivity type provided on the fifth cladding layer, the sixth cladding layer being made of InGaAlP based material whose composition is substantially the same as that of the third cladding layer, and at least a part of the sixth cladding layer having a ridge stripe including:
a second upper portion having vertical sidewalls; and
a second lower portion having sidewalls inclined so that the stripe becomes wider toward the second active layer.

2. The semiconductor laser device according to claim 1, wherein a bottom width of the first lower portion is greater than 1.5 μm, a bottom width of the second lower portion is greater than 1.5 μm, and both of the AlGaAs based laser element and the InGaAlP base laser element generate self-sustained pulsation in a wider range higher than a predetermined output power.

3. The semiconductor laser device according to claim 1, wherein at least one of the InGaAlP based laser element and the AlGaAs based laser element includes a current blocking layer on both sides of the ridge stripe.

* * * * *